(12) United States Patent
Mihnea et al.

(10) Patent No.: US 8,351,243 B2
(45) Date of Patent: Jan. 8, 2013

(54) TRANSISTOR DRIVEN 3D MEMORY

(75) Inventors: Andrei Mihnea, San Jose, CA (US); George Samachisa, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 191 days.

(21) Appl. No.: 12/947,553

(22) Filed: Nov. 16, 2010

(65) Prior Publication Data

US 2012/0120709 A1 May 17, 2012

(51) Int. Cl.
*G11C 11/00* (2006.01)
*H01L 29/06* (2006.01)

(52) U.S. Cl. ...... 365/148; 365/163; 257/5; 257/E21.645

(58) Field of Classification Search .................. 365/148, 365/163; 257/2–5, E21.645
See application file for complete search history.

(56) References Cited

U.S. PATENT DOCUMENTS

| | | | |
|---|---|---|---|
| 6,881,994 B2 | 4/2005 | Lee et al. | |
| 6,952,030 B2 | 10/2005 | Herner et al. | |
| 7,701,746 B2 | 4/2010 | Meeks et al. | |
| 7,745,312 B2 | 6/2010 | Herner et al. | |
| 2005/0063220 A1 | 3/2005 | Johnson | |
| 2006/0273298 A1 | 12/2006 | Petti | |
| 2007/0114509 A1 | 5/2007 | Herner | |
| 2008/0121860 A1 | 5/2008 | Matsuoka et al. | |
| 2008/0239790 A1 | 10/2008 | Herner et al. | |
| 2009/0001337 A1 | 1/2009 | Furukawa | |
| 2009/0168492 A1 | 7/2009 | Thorp et al. | |
| 2010/0173457 A1 | 7/2010 | Herner et al. | |

FOREIGN PATENT DOCUMENTS

WO 2007008902 A2 1/2007

OTHER PUBLICATIONS

International Search Report & Written Opinion, issued in PCT Application No. PCT/US2011/060812, mailed on May 29, 2012.

*Primary Examiner* — Allison P Bernstein
(74) *Attorney, Agent, or Firm* — The Marbury Law Group PLLC

(57) ABSTRACT

A nonvolatile memory device with a first conductor extending in a first direction and a semiconductor element above the first conductor. The semiconductor element includes a source, a drain and a channel of a field effect transistor (JFET or MOSFET). The nonvolatile memory device also includes a second conductor above the semiconductor element, the second conductor extending in a second direction. The nonvolatile memory device also includes a resistivity switching material disposed between the first conductor and the semiconductor element or between the second conductor and the semiconductor element. The JFET or MOSFET includes a gate adjacent to the channel, and the MOSFET gate being self-aligned with the first conductor.

7 Claims, 2 Drawing Sheets

TRANSISTOR DRIVEN 3D MEMORY

FIELD

The present invention is directed to a nonvolatile memory cell with a transistor driving element.

BACKGROUND

Nonvolatile memory arrays maintain their data even when power to the device is turned off. In one-time-programmable arrays, each memory cell is formed in an initial unprogrammed state, and can be converted to a programmed state. This change is permanent, and such cells are not erasable. In other types of memories, the memory cells are erasable, and can be rewritten many times. A resistivity switching element is typically used for the programmable or storage element of the memory cell.

The resistivity switching element has more than one stable resistivity which depends on the crystal structure of the material of which it is made. A resistivity of the resistivity switching material can be changed, for example, by applying a voltage above a predetermined threshold voltage, thereby changing the crystal structure or forming a conductive link through a dielectric. Some resistivity materials are reversible. That is, application of a voltage above a second predetermined threshold results in the material returning to its previous crystal structure. Still other materials have more than two stable crystal structures and can provide more than two resistivity states.

Three dimensional switching memories use a selector device (steering element) in series with each resistivity switching element. The selector device reduces undesired leakage current which may flow through half-selected and unselected cells in the array when voltage is applied to a selected cell. Conventional three dimensional switching memories are configured to use unipolar switching. For unipolar switching, the selector device may be unidirectional, for example a diode.

SUMMARY

One embodiment relates to a nonvolatile memory device with a first conductor extending in a first direction and a semiconductor element above the first conductor. The semiconductor element includes a source, a drain and a channel of a metal oxide semiconductor field effect transistor (MOSFET). The nonvolatile memory device also includes a second conductor above the semiconductor element, the second conductor extending in a second direction. The nonvolatile memory device also includes a resistivity switching material disposed between the first conductor and the semiconductor element or between the second conductor and the semiconductor element. The MOSFET includes a gate adjacent to the channel, the gate being self-aligned with the first conductor.

Another embodiment relates to a nonvolatile memory device with a first conductor extending in a first direction and a semiconductor element above the first conductor, the semiconductor element including a source, a drain and a channel of a metal oxide semiconductor field effect transistor (MOSFET). The nonvolatile memory device also includes a second conductor above the semiconductor element and a resistivity switching material disposed between the first conductor and the semiconductor element or between the second conductor and the semiconductor element. The nonvolatile memory device is configured to convert the resistivity switching material from a lower resistivity state to a higher resistivity state by application of a forward bias from the MOSFET and from a higher resistivity state to a lower resistivity state by application of a reverse bias from the MOSFET.

Another embodiment relates to a nonvolatile memory device including a plurality of memory cells aligned in rows and columns. The device also includes a plurality of first conductors, each of the first conductors extending in a first column direction and each first conductor operably coupling the memory cells in a column of memory cells. The device also includes a plurality of second conductors, each of the second conductors extending in a second row direction and the second conductors operably coupling the memory cells in a row of memory cells. Each of the plurality of memory cells is located at an intersection of a first conductor and a second conductor. Further, each memory cell includes a semiconductor element above the first conductor, the semiconductor element comprising a source, a drain and a channel of a junction field effect transistor (JFET) and a resistivity switching material disposed between the first conductor and the semiconductor element or between the second conductor and the semiconductor element. A common gate is located adjacent to the channels of the JFETs in a plurality of memory cells in a plurality of columns and a plurality of rows.

Another embodiment relates to a method of programming a nonvolatile memory. The method includes a step of applying a first voltage to a transistor operatively coupled to a resistivity switching material to change the resistivity of the resistivity changing material from a first resistivity state to a second resistivity state, where the second resistivity state is different from the first resistivity state. The method also includes a step of applying a second voltage to the transistor to change the resistivity of the resistivity changing material from the second resistivity state to the first resistivity state. Further, the first voltage is a first polarity voltage and the second voltage is an opposite polarity second voltage.

Another embodiment relates to a method of making a nonvolatile memory. The method includes steps of forming a first conducting layer extending in a first direction and forming a semiconductor element above the first conducting layer, the semiconductor element including a source, a drain and a channel of a metal oxide semiconductor field effect transistor (MOSFET). The method also includes steps of forming a resistivity switching material above or below the semiconductor element, depositing a gate material adjacent to the channel of the MOSFET, etching the gate material and the first conductor in the same etch step to from a MOSFET gate so that the gate is self-aligned with the first conductor and forming a second conducting layer above the semiconductor element, the second conducting layer extending in a second direction.

DETAILED DESCRIPTION

As discussed above, unipolar switching of resistivity switching elements and the use of a unidirectional diode for steering nonvolatile memory arrays containing these switching elements are known. The inventors have discovered, however, that switching elements such as metal-oxide RRAM MIM devices may work better in bipolar mode, i.e. running set and reset current in opposite directions. A bidirectional selector device, e.g., a transistor, is better suited for bipolar switching. The field effect transistor is configured for symmetric operation.

For the purposes of this application, "unipolar" switching is defined as running set and reset currents in the same direction. For "bipolar" switching, the set and reset current run in opposite directions.

A nonvolatile memory includes a multitude of individual memory cells. Typically, the multitude of memory cells are configured in an array of rows and columns The cells in one row may be electrically connected by one of a plurality of word lines while the cells in one column may be electrically connected by one of a plurality of bit lines. Alternatively, rows may be designated as bit lines and columns as word lines.

Figure 1:
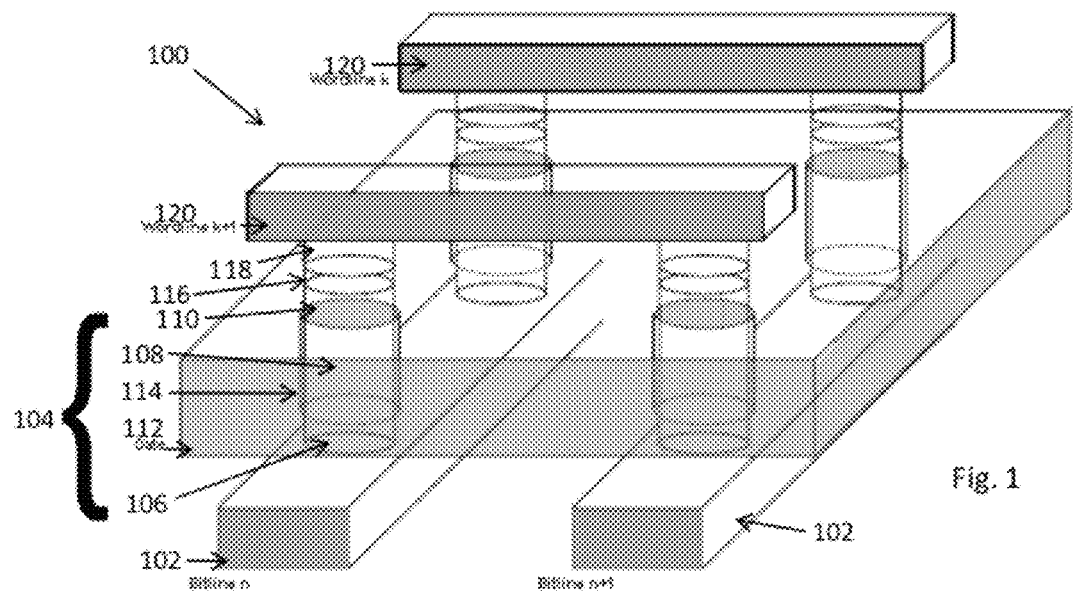
FIG. 1 is a perspective view of a first embodiment of a three dimensional nonvolatile switching memory.

FIG. 1 illustrates a three dimensional nonvolatile switching memory 100 according to a first embodiment. A bottom plurality of conductors 102 are formed on a substrate (not shown) and extend in a first direction. The bottom conductors 102 may comprise any conducting material known in the art, such as tungsten and/or other materials, including aluminum, tantalum, titanium, copper, cobalt, or alloys thereof.

An insulating layer (not shown) may be formed between the substrate and the bottom conductor. The insulating layer may be silicon oxide, silicon nitride, high-dielectric constant film, Si—C—O—H film, or any other suitable insulating material.

Barrier and adhesion layers may be included in bottom conductor 102. The barrier layer may be, for example, TiN. If the upper surface of the bottom conductor 102 is tungsten, then tungsten nitride can be formed on top of the conductor 102 instead of TiN by nitriding the upper surface of the tungsten. For example, the following conductive layer combinations may be used: Ti (bottom)/Al/TiN (top), or Ti/TiN/Al/TiN, or Ti/Al/TiW, or any combination of these layers.

A transistor 104 having a one of a drain or source (e.g. drain) 106, a channel 108, and another one of the drain or source (e.g. source) 110 may be formed over the bottom conductor 102. A gate 112 partially or fully surrounds the channel 108. The gate 112 may be made of heavily doped polycrystalline silicon or any other suitable conductor. In this embodiment, all the transistors 104 in a device level of the three dimensional nonvolatile switching memory 100 share a common gate 112. In an embodiment, an insulating layer is formed between the gate 112 and the bottom conducting layer 102. Optionally, a gate insulating layer 114 may be formed between the gate 112 and the channel 108. The gate insulating layer 114 may be either deposited or grown. In an embodiment, a silicon oxide gate insulating layer 114 may be formed by thermal oxidation of the silicon channel before depositing the gate material. Alternatively, the gate insulating layer 114 may be made by depositing silicon oxide around the pillars (discussed in more detail below). As discussed in more detail below, the addition of the gate insulating material allows the transistor 104 to be configured as a MOSFET.

A transistor 104 without the gate insulating layer 114 may be configured as a junction field effect transistor (JFET). In the JFET configuration, the gate 112 generally has a different polarity from the drain (source) 106, channel 108 and source (drain) 110. For example, the gate 112 may be an n-type semiconductor while the drain (source) 106, channel 108 and source (drain) 110 are a p-type semiconductor or vice versa. With the addition of the gate insulating layer 114, the transistor may be configured as a metal oxide semiconductor field effect transistor (MOSFET). The transistor 104 active region (e.g., channel 108, source 110, drain 106) may be made of any semiconducting material. In an embodiment, the transistor 104 active regions are made of polycrystalline silicon. However, the transistor may also be made of amorphous, single crystal or microcrystalline silicon. In an embodiment, the drain (source) 106 and the source (drain) 110 may have an opposite conductivity type to that of the channel 108 (e.g., doped with opposite conductivity type dopants to form a npn or pnp type drain-channel-source type transistor). Alternatively, the drain (source) 106, channel 108 and the source (drain) 110 may have the same conductivity type (doped with same conductivity type dopants to form a nnn or ppp type drain-channel-source type transistor). In this embodiment, the gate 112 may comprises material of the same or opposite polarity as the drain (source) 106, channel 108 and the source (drain) 110.

A resistivity switching element 118 is then formed above the transistor 104. Optionally, a conducting layer 116 may be formed between the resistivity switching element 118 and the transistor 104. Further, in an alternative embodiment, the resistivity switching element 118 is formed below the transistor 104. The resistivity switching element 118 may be, for example, a thin silicon oxide antifuse dielectric layer. Other materials suitable for the resistivity switching element 118 include other metal oxides such as nickel oxide, chalcogenides, doped polycrystalline silicon, carbon materials (e.g., carbon nanotubes, graphene, amorphous carbon, polycrystalline carbon, etc.).

The combination of a transistor 104 and a resistivity switching element 118 may be used as a memory cell. The three dimensional nonvolatile switching memory 100 comprises a plurality of device levels where a plurality of memory cells are aligned in rows and columns in each device level. Each of the memory cells comprises a FET (JFET or MOSFET) steering element and a resistivity switching element 118.

A top conductor 120 is then formed above the switching element. The top conductor 120 may be formed in the same manner and of the same materials as bottom conductor 102, and extends in a second direction different from the first direction such as perpendicular to the first direction. Transistor 104 is vertically disposed between bottom conductor 102 and top conductor 120. In an embodiment, the source 110, drain 106, channel 108 and the resistivity switching element 118 may arranged in a pillar. The gate 112 may fully or partially surround the pillar. As illustrated, the bottom conductor 102 is configured as a bit line while the top conductor 120 is configured as a word line. Alternatively, the bottom conductor 102 may be configured as a word line while the top conductor 120 may be configured as a bit line. Additionally, an insulating layer may be formed above top conductor 120 and a new layer of devices formed. In this manner, a three dimensional nonvolatile switching memory 100 having a plurality of device layers can be formed.

Thus, as described above, FIG. 1 shows one device level of nonvolatile memory device comprising a plurality of memory cells 104+118 aligned in rows and columns This device level also includes a plurality of bit line conductors 102 extending in a column direction and operably coupling the memory cells in a column of memory cells, and a plurality of word line conductors 120 extending in a row direction and operably coupling the memory cells in a row of memory cells. Each of the plurality of memory cells 104+118 is located at an intersection of a first conductor 102 and a second conductor 120. Each memory cell comprises a semiconductor element, such as an active region of a FET comprising a source 110, a drain 106 and a channel 108, and a resistivity switching material 118 disposed between the first conductor 102 and the semiconductor element or between the second conductor 120 and the semiconductor element (e.g., the switching material 118 may be located below or above the FET active region). A common gate 112 is located adjacent to the channels 108 of the FETs in a plurality of memory cells in a plurality of columns and a plurality of rows. In other words, the single common gate 112 controls the FETs 104 in a plurality of rows and columns of the device.

Because the transistor 104, unlike the diode of the prior art, allows current to flow in two directions, bipolar switching is enabled. That is, with suitable application of voltages between the source 110, drain 106 and gate 112, current can be made to flow up or down the pillar. Further, if the transistor 104 is a MOSFET, the transistor 104 is capable of swinging from depletion to accumulation modes.

Figure 2:
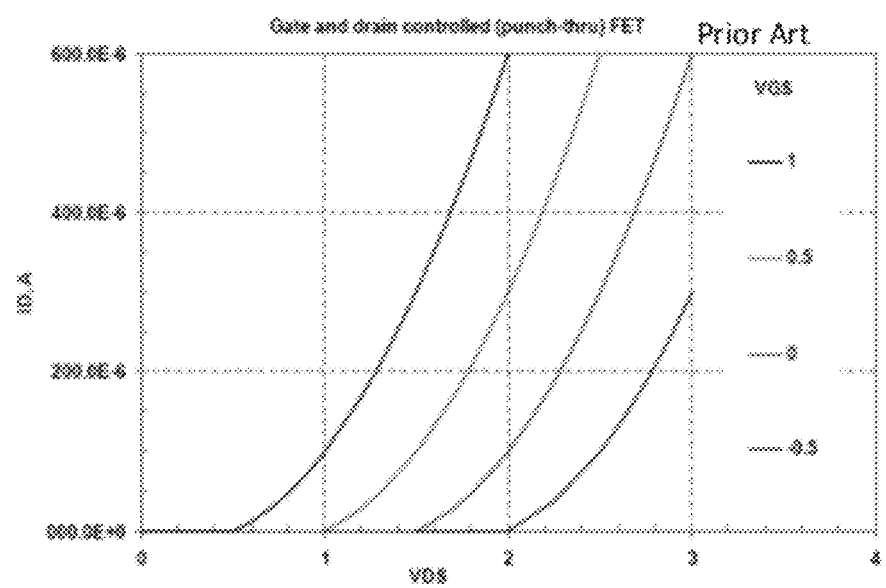
FIG. 2 is a plot of drain current characteristics of a transistor suitable for use with the switching memory of FIG. 1.

FIG. 2 illustrates the drain current characteristics of a transistor 104 suitable for use as a steering or selector element for the three dimensional nonvolatile switching memory 100. The drain current characteristics are for a JFET configuration. That is, a memory cell without a gate insulating layer 114. In this configuration, the channel 108 is open and current flows unless a voltage is applied to the gate 112. A gate voltage is applied to pinch the channel 108 and stop the flow of current.

The transistor (JFET) 104 for the three dimensional nonvolatile switching memory 100 is a double action device. That is, to activate a cell of the three dimensional nonvolatile switching memory 100, voltage is applied to both the gate 112 ($V_{SG}$) and the drain 106 ($V_{SD}$). Both voltages are used because the common gate 112 spans all of the columns (bit lines 102) of transistors 104. That is, all of the columns share a common gate 112 and therefore to select a particular cell the voltage must be applied to the drain 106 via the bottom conductor (bit line) 102.

The three dimensional nonvolatile switching memory 100 may be programmed by applying one or more voltages above one or more predetermined thresholds. For example, a first voltage may be applied to change the resistivity switching element 118 from a low resistivity state to a high resistivity state. A second voltage may be applied to change the resistivity switching element 118 from the high resistivity state to low high resistivity state. Further, the polarity of the voltages need not be the same. That is, the first voltage may have a first polarity and the second voltage have a second polarity. For example, the first voltage may be a forward bias while the second voltage may be a reverse bias. Further, with application of suitable voltages, the transistor 104 may swing from a conductive state to a non-conductive state (i.e. from a space-charge neutral channel mode to a depleted channel mode), and back.

Figure 3:
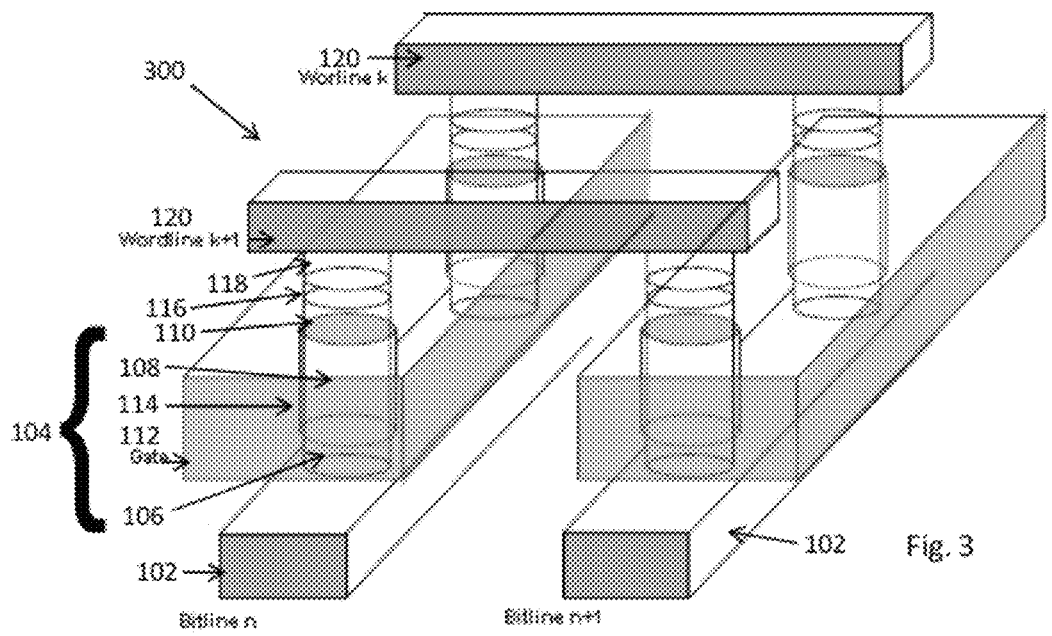
FIG. 3 is a perspective view of another embodiment of a three dimensional nonvolatile switching memory.

FIG. 3 is a perspective view of another embodiment of a three dimensional nonvolatile switching memory 300. This embodiment is similar to the embodiment illustrated in FIG. 1. However, in this embodiment the gate 112 is split between bit lines 102. That is, only the cells of the memory 300 that are electrically connected to a given bit line 102 share a common gate 112. The gates 112 for each bit line 102 are electrically isolated from each other. In this manner, the active gate 112 takes over the role of the bit line 102. That is, the gate 112 can be used for selecting a memory cell—it is not necessary to apply a voltage to both the gate 112 and the drain 106 to select a cell of a memory 300.

When fabricating the dimensional nonvolatile switching memory 300, gate 112 can be self-aligned with the bottom conductor 102. That is, a layer of gate material may be deposited on an insulating layer over the bottom conductor material before the bottom conductor material is patterned to form the bottom conductor 102. In this way, a single patterning step (described in more detail below) can be performed to pattern the bottom conductor 102 and the gate 112, thereby self-aligning the bottom conductor 102 and the gate 112. Further, if layers corresponding the drain, 106, channel 108 and source 110 are deposited prior to patterning, a transistor 104 having the configuration of a pillar may be formed with a gate 112 self aligned with the bottom conductor 102. In an embodiment, the transistor is a pillar of silicon (polycrystalline, single crystal, microcrystalline or amorphous) and the gate insulating layer is formed by oxidizing the transistor channel, thus forming the gate oxide on the sidewalls of the transistor.

Figure 4:
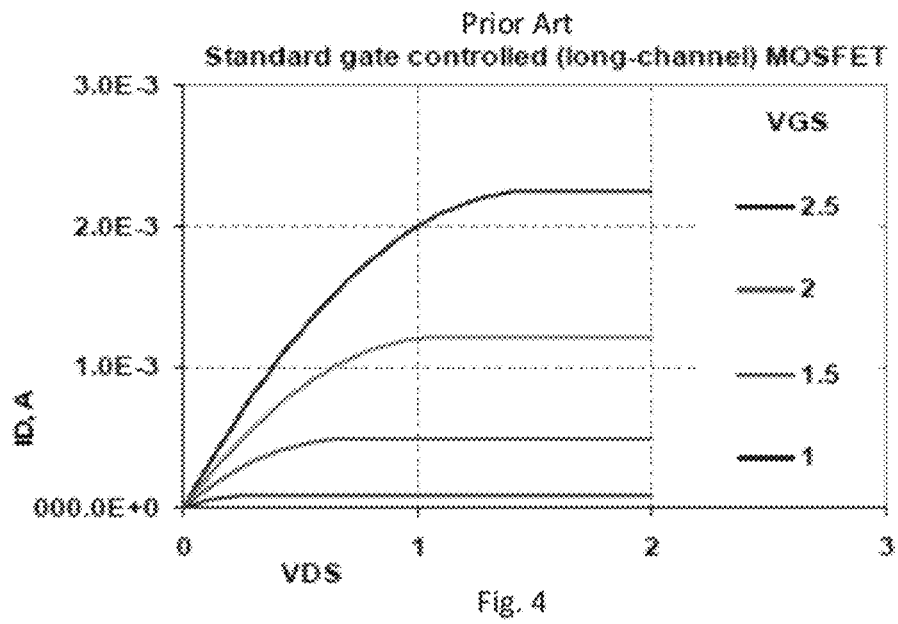
FIG. 4 is a plot of drain current characteristics of a transistor suitable for use with the switching memory of FIG. 3.

FIG. 4 is a plot of drain current characteristics of a transistor 104 suitable for use with the switching memory 300 of FIG. 3. The drain current characteristics are for a MOSFET configuration. That is, a memory cell with a gate insulating layer 114. Unlike the JFET configuration illustrated FIG. 1 in which the transistor 104 is on until a voltage is applied to the gate 112, the MOSFET switching memory 300 is off until a voltage is applied to the gate 112. That is, the application of a gate voltage induces electrical conductivity for the channel 108, allowing current to flow from the source 110 to the drain 106.

In an embodiment, applying a forward source-drain bias to the MOSFET converts the resistivity switching material of the resistivity switching element 118 from a lower resistivity state to a higher resistivity state. In an embodiment, applying a reverse source-drain bias to the MOSFET converts the resistivity switching material from a higher resistivity state to a lower resistivity state.

In this embodiment, the MOSFET steering device can swing across a larger current conductivity range between channel depletion and channel-surface accumulation, in contrast with the JFET which can swing only between channel depletion and channel neutral state. This may provide better selectability and higher drive current for each cell for the memory array 300 compared with the memory array 100. This is reflected in the exemplary transistor current ranges depicted in FIGS. 2 and 4

Methods of making the three dimensional nonvolatile switching memory 100 will now be described. The three dimensional nonvolatile switching memory 100 is formed over a substrate (not shown). The substrate can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or nonsemiconducting material, such as glass, plastic, metal or ceramic substrate. The substrate may include integrated circuits fabricated thereon, such as driver circuits for a memory device. An insulating layer (not shown) is preferably formed over substrate. The insulating layer can be silicon oxide, silicon nitride, high-dielectric constant film, Si—C—O—H film, or any other suitable insulating material.

The first conducting layer is then formed over the substrate and the insulating layer. A barrier layer (not shown), such as a TiN layer is deposited on top of the first conductive layer. If upper surface of the first conductive layer is tungsten, then tungsten nitride can be formed on top of the conductive layer instead of TiN by nitriding the upper surface of the tungsten. For example, the following conductive layer combinations may be used: Ti (bottom)/Al/TiN (top), or Ti/TiN/Al/TiN, or Ti/Al/TiW, or any combination of these layers. The bottom Ti or Ti/TiN layers can act as adhesion layers, the Al layer can act as the conductive layer, and the TiN or TiW layer on top can serve as the barrier layer as well as an antireflective coating for patterning the electrodes 102.

Finally, the conductive layer and the barrier layer are patterned using any suitable masking and etching process. In one embodiment, a photoresist layer is deposited over the barrier layer patterned by photolithography, and the layers are etched using the photoresist layer as a mask. The photoresist layer is then removed using standard process techniques. The conductive layer and the barrier layer may be patterned into rail shaped bottom electrodes 102 of memory devices. Alternatively, the electrodes 102 may instead be formed by a Damascene method, in which at least the conductive layer is formed in grooves in an insulating layer by deposition and subsequent planarization.

Next an insulating layer is deposited over and between electrodes 102. The insulating layer can be any electrically insulating material, such as silicon oxide, silicon nitride, or silicon oxynitride. The insulating layer may be deposited in one step and then planarized by CMP for a desired amount of time to obtain a planar surface and to expose the electrodes 102. Alternatively, the insulating layer may be deposited as two separate sublayers, where a first sublayer is formed between the electrodes 102 and a second sublayer is deposited over the first sublayer and over the electrodes 102. A first CMP step may be used to planarize the first sublayer using barrier layer as polish stop. A second CMP step may be used to planarize the second sublayer for a desired amount of time to obtain a planar surface and expose the electrodes 102.

Semiconductor layers which will form the active regions of the transistors are formed above the electrodes 102. The semiconductor material can be polycrystalline, amorphous, single crystal or microcrystalline silicon, germanium or any suitable compound semiconductor material, such as SiGe, III-V or II-VI materials. The layers can be deposited, for example, by chemical vapor deposition (CVD). The first drain or source region 106 layer of the transistor 104 can be formed by deposition of a first conductivity type (e.g., n-type) semiconductor layer. The channel region 108 layer can then be formed by deposition of a semiconductor layer of the opposite conductivity type (e.g., p-type). The second drain or source region 110 layer is then formed by deposition of a first conductivity type (e.g., n-type) semiconductor layer over the channel region 108 layer. Alternatively, the drain 106, channel 108 and source 110 regions may have same conductivity type (i.e., the same doping type or polarity e.g. n-type), as was specified above. Material for the conductive layer 116 (e.g., titanium nitride layer) may then be deposited followed by deposition of a layer of material (e.g., nickel oxide) that will be used to form the resistivity switching element 118. Alternatively, the material that will be used to form the resistivity switching element 118 may be formed below the semiconductor layers described above.

The above described semiconductor and resistivity switching material layers are then patterned by photolithography and etching to form pillars shown in FIG. 1. Each pillar includes the active region (e.g., source, channel and drain 106, 108, 110 regions) of the transistor 104, the optional conductive layer 116 and the resistivity switching element 118.

An insulating layer, such as silicon oxide, is then deposited around the pillars. This may be followed by planarization and/or etch back of the insulating layer to expose the channel region 108 and the source or drain region 110. This insulating layer prevents the gate 112 from shorting to the bottom conductor/electrode 102 by being located between the gate material and the conductor 102.

To make the common gate 112 of a JFET 104 shown in FIG. 1, a gate material (e.g., heavily doped polysilicon or metal) layer is deposited around and between the pillars and over the above described insulating layer. After the gate material is deposited, it may be planarized by CMP and/or etched back so that the common gate 112 does not extend above the pillars. An insulating layer, such as silicon oxide, is then deposited over the common gate followed by planarization and/or etch back to expose tops of the pillars.

The upper electrodes 120 may be formed in the same manner as the bottom electrodes 102. That is, a layer of conductive material is deposited over the pillars and the insulating layer. The conductive material layer is patterned and etched using any suitable masking and etching technique to form substantially parallel, substantially coplanar conductor/electrode 120 rails, extending perpendicular to conductor/electrode 102 rails. In a preferred embodiment, photoresist is deposited, patterned by photolithography and the layers etched, and then the photoresist removed using standard process techniques.

In an alternative method, the three dimensional nonvolatile switching memory is formed with the gate 112, such as MOSFET gate, self-aligned with the bottom conductor/electrode 102 as shown in FIG. 3. In this embodiment, the method steps are the same as the above described method steps up to the formation of the gate 112, except that the bottom conducting layer is not patterned into bottom conductor/electrode 102 rails prior to forming the pillars. Instead, the pillars are formed over an unpatterned conducting layer.

A gate insulating layer 114 may then be deposited or grown on the semiconductor material of the channel 108 of the pillars. For example, layer 114 may be grown by thermal oxidation of the sidewall of the semiconductor pillar (e.g., forming a silicon oxide layer 114 by oxidizing a silicon channel 108) before depositing the gate 112 material. Alternatively, a thin gate insulating layer (e.g., silicon oxide) may be deposited around the pillars and optionally planarized.

The gate 112 material layer is then deposited over and between the pillars. The gate 112 material layer may optionally be planarized and/or etched back. The gate 112 material layer and the bottom conductor 102 layer are then etched in the same etching step. A photoresist pattern is formed over the gate 112 material layer. This gate material layer and the bottom conductive layer are patterned into gate 112 rails and conductor/electrode 102 rails extending in the column (e.g., bit line) direction by etching using the same photoresist pattern as a mask. The photoresist pattern may be removed after etching the gate 112 rails and then the gate 112 rails may be used as a mask to etch the conductor 102 rails.

Since the gates 112 and the bottom conductors 102 are formed in the same etch step, this results in a structure in which each gate 112 is self-aligned with the respective bottom conductor/electrode 102. The gap between columns of pillars, the gate 112 rails and conductor 102 rails may then be filled with an insulating fill material, such as silicon oxide. The fill material may be planarized and/or etched back to expose the top of the pillars. The top conductors 120 may then be formed in contact with the tops of the pillars, as in the previous embodiment.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A nonvolatile memory device comprising a plurality of memory cells aligned in rows and columns, comprising:
   a plurality of first conductors, each of the first conductors extending in a first column direction, each first conductor operably coupling the memory cells in a column of memory cells; and
   a plurality of second conductors, each of the second conductors extending in a second row direction, the second conductors operably coupling the memory cells in a row of memory cells,
   wherein each of the plurality of memory cells is located at an intersection of a first conductor and a second conductor, and
   wherein each memory cell comprises:
      a semiconductor element above the first conductor, the semiconductor element comprising a source, a drain and a channel of a junction field effect transistor (JFET); and
      a resistivity switching material disposed between the first conductor and the semiconductor element or between the second conductor and the semiconductor element,
   wherein a common gate is located adjacent to the channels of the JFETs in a plurality of memory cells in a plurality of columns and a plurality of rows.

2. The device of claim 1, wherein the JFET is bidirectional.

3. The device of claim 1, wherein an applied forward drain to source bias above a first predetermined threshold voltage to the JFET results in the resistivity switching material switching from a lower resistivity state to a higher resistivity state.

4. The device of claim 1, wherein the JFET is turned on by a gate voltage and a source-drain voltage.

5. The device of claim 4, wherein an applied reverse drain to source bias above a second predetermined threshold voltage to the JFET results in the resistivity switching material switching from a higher resistivity state to a lower resistivity state.

6. The device of claim 1, wherein the gate comprises polycrystalline silicon which contacts the channel.

7. The device of claim 1, wherein the common gate contacts the channels of the JFETs.

* * * * *